United States Patent [19]

Matsumura et al.

[11] Patent Number: 5,239,446
[45] Date of Patent: Aug. 24, 1993

[54] WATERTIGHT CASING FOR ELECTRONIC APPARATUS AND ASSEMBLING METHOD THEREFOR

[75] Inventors: Tetsuo Matsumura, Tokyo; Takahiro Hayashi, Yokohama, both of Japan

[73] Assignee: Matsushita Electric Industrial Co., Ltd., Osaka, Japan

[21] Appl. No.: 884,759

[22] Filed: May 18, 1992

[30] Foreign Application Priority Data

May 24, 1991 [JP] Japan .................................. 3-120484

[51] Int. Cl.⁵ .............................................. H05K 5/06
[52] U.S. Cl. ..................................... 361/736; 174/52.3
[58] Field of Search .................. 439/76; 206/328, 334, 206/811; 174/52.3; 361/380, 392, 395

[56] References Cited

U.S. PATENT DOCUMENTS 3,873,757  3/1975  Berke et al. .

FOREIGN PATENT DOCUMENTS 57-44713  1/1979  Japan .................................. 361/395
2013437   8/1979  United Kingdom .

Primary Examiner—Leo P. Picard
Assistant Examiner—Michael W. Phillips
Attorney, Agent, or Firm—Stevens, Davis, Miller & Mosher

[57] ABSTRACT

A watertight casing for electronic apparatus includes a first case, a second case and a cover. Sealing members are interposed between the first case and the second case, and between the second case and the cover, respectively. The first and the second cases and the cover are fastened tightly together. The first case is provided with a recess portion into which a printed circuit board is received. The printed circuit board mounts electronic parts on one side thereof, and a battery on the other side. Another sealing member is interposed between the second case and the other side of the printed circuit board.

5 Claims, 1 Drawing Sheet

WATERTIGHT CASING FOR ELECTRONIC APPARATUS AND ASSEMBLING METHOD THEREFOR

BACKGROUND OF THE INVENTION

The present invention relates to a casing having a watertight structure which is available for portable electronic apparatus or the like. The present invention also relates to a method for assembling such casing.

In a conventional casing of this type, a cup-shaped case houses therein electronic parts. A cover is attached to the case through a sealing member interposed therebetween so as to close an opening of the case, thereby defining a watertight casing. The sealing member prevents water contained in the atmosphere from penetrating into an interior of the casing.

The casing encounters a problem in that it is impossible to prevent water contained in the atmosphere from entering into the interior of the casing when the cover is detached for the purpose of exchanging the electronic parts since the interior of the casing is exposed.

SUMMARY OF THE INVENTION

An object of the present invention is to provide a casing which can overcome the above-mentioned problem of the conventional art. More specifically, it is an object to provide a casing which can prevent water from penetrating into an interior of a casing even when a cover is detached.

To this end, the present invention provides a casing which comprises a printed circuit board, a first case provided with a recess portion into which the printed circuit board is received, a second case attached to the first case so as to cover an opening of the recess portion of the first case, which is provided with a through hole within which an exchangeable part is received, a cover member attached to the second case so as to close an opening of the through hole, and sealing members disposed between the first case and the second case, between the printed circuit board and the second case, and between the second case and the cover member, respectively.

According to the present invention, since the printed circuit board receiving recess portion of the first case is sealed by means of the sealing members disposed between the first case and the second case and between the printed circuit board and the second case, it is possible to prevent water from penetrating into the recess portion even when the cover is detached.

DETAILED DESCRIPTION OF THE PREFERRED EMBODIMENTS

Figure 1:
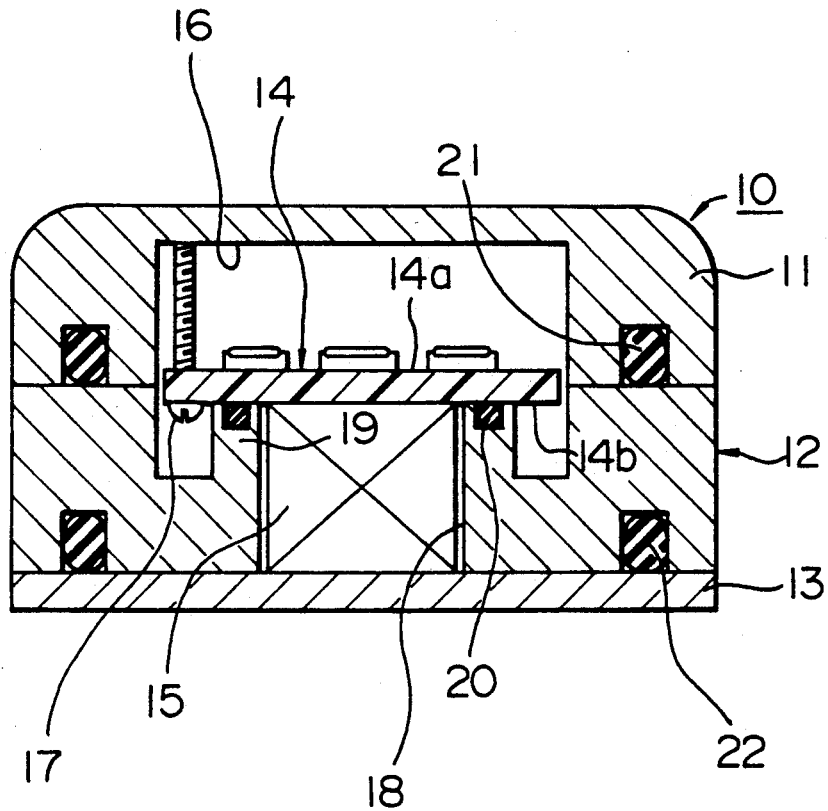
FIG. 1 is a sectional view showing a casing according to one embodiment of the present invention.

Referring to FIG. 1, a casing 10 includes a first case 11, a second case 12, and a cover 13. The casing 10 further includes a printed circuit board 14, on one side 14a of which electronic parts are mounted and on the other side 14b of which a battery 15 for driving the printed circuit board 14 is provided.

The first case 11 is provided with a recess portion 16. The printed circuit board 14 is so attached to the first case 11 by means of a screw 17 that the side 14a of the printed circuit board 14 is faced towards the recess portion 16.

The second case 12 is provided with a through hole 18 for the battery 15 and an annular land portion 19 around the through hole 18. The printed circuit board 14 is seated on the land portion 19 through a sealing member 20 disposed within a groove formed therein.

Between the cases 11 and 12 a sealing member 21 is interposed, which is disposed within a groove formed in the first case 11. A sealing member 22 is interposed between the second case 12 and the cover 13, which is disposed within a groove formed in the second case 12.

The first and the second cases 11, 12 and the cover 13 are fastened tightly together by means of screws (not shown). The sealing members 20–22 are watertightly press-fitted against contact surfaces of the printed circuit board, the second case and the cover due to the fastening forces of the screws.

An assembling operation of this casing will be described hereinafter.

At first, the printed circuit board 14 is inserted into the recess portion 16 of the first case 11 so as to face the electronic parts mounting side 14a towards the recess portion 16, and then fixed to the first case 11 by means of the screw 17. The sealing members 20 and 21 are fitted into the respective grooves of the land portion of the second case 12 and of the first case 11. The first case 11 and the second case 12 are put together so that the battery 15 is received in the through hole 18 of the second case 12, and then fastened together by the screws (not shown). Further the sealing member 22 is fitted into the groove of the second case 12. The cover 13 is attached to the second case 12 by the screws (not shown) so as to close an opening of the through hole 18.

Under a normal operation condition, an interior of the casing 10, into which the electronic parts on the printed circuit board 14 is housed, is watertightly sealed by means of the sealing members 21 and 22. If it is required to replace the battery 18 with a new one, the cover 13 must be detached from the casing 10 for this purpose. When the cover 13 is detached, the interior of the casing 10 is still maintained under a watertight condition. Specifically, the seal between the second case 12 and the printed circuit board 14 is conducted by the sealing member 20, and the seal between the first case 11 and the second case 12 is conducted by the sealing member 21. Therefore, it can be possible to prevent water from penetrating into the interior of the casing 10 even when the cover 13 is detached.

Figure 2:
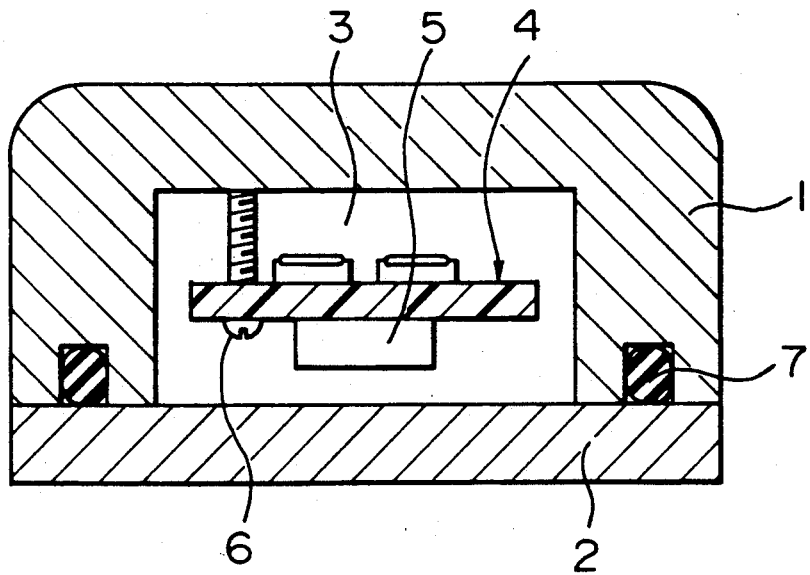
FIG. 2 is a sectional view showing a casing according to the prior art.

To the contrary, as shown in FIG. 2, a conventional casing includes a single cup-shaped case 1 and a cover 2. The cover 2 is attached to the case 1 so as to define therebetween a space 3 for a printed circuit board 4. The printed circuit board 4 mounting electronic parts and a battery 5 is disposed within the printed circuit board space and fixed to the case 1 by means of a screw 6. A seal between the case 1 and the cover 2 is conducted only by a sealing member 7. If the cover 2 is detached to replace the battery 5 with a new one, water contained in the atmosphere enters into the printed circuit board space to deteriorate the electronic parts.

What is claimed is:

1. A watertight casing for electronic apparatus, said casing comprising:
   a printed circuit board;
   a first case provided with a recess portion in which said printed board is disposed;

a second case attached to said first case so as to cover said recess portion, said second case being provided with a through hole for receiving an exchangeable part;

a cover member attached to said second case so as to close said through hole; and a first sealing member disposed between said first case and said second case, a second sealing member disposed between said printed board and said second case, and a third sealing member disposed between said second case and said cover member.

2. A watertight casing according to claim 1, wherein said exchangeable part is a battery for driving said printed circuit board.

3. A watertight casing for electronic apparatus, said casing comprising:

a printed circuit board having electronic parts mounted on one side thereof;

a first case provided with a recess portion having a bottom portion, said printed board being disposed within said recess portion such that said one side faces towards said bottom portion;

a second case having one end face attached to said first case so as to close said recess portion, said second case being provided with (a) a through hole for receiving an exchangeable part adapted to be provided at another side of said printed circuit board opposite to said one side, and (b) a land portion on which said printed circuit board is seated;

a cover member attached to another end face of said second case opposite to said one end face so as to close said through hole;

a first sealing member interposed between said first case and said second case;

a second sealing member interposed between said second case and said cover member; and a third sealing member interposed between said printed circuit board and said land portion of said second case, said third sealing member being located closer to a center point of said casing than is said first sealing member.

4. A method for assembling a watertight casing for electronic apparatus, the casing including a first case having a recess portion, a second case having a through hole for receiving an exchangeable part, a cover member, a printed circuit board, a first sealing member, a second sealing member and a third sealing member, said method including the following steps of:

mounting the printed circuit board into the recess portion of the first case;

fixing the second case into said first case with said first sealing member interposed between said first case and said second case and with said second sealing member interposed between said second case and said printed circuit board; and fixing said cover member to said second case with said third sealing member interposed therebetween, so as to close said through hole formed in said second case.

5. A method according to claim 4, wherein said exchangeable part is a battery for driving said printed circuit board and said method further comprises positioning said battery in said through hole.

* * * * *